(12) United States Patent
Yong

(10) Patent No.: US 11,430,819 B2
(45) Date of Patent: Aug. 30, 2022

(54) ARRAY SUBSTRATE AND MANUFACTURING METHOD THEREOF

(71) Applicant: TCL China Star Optoelectronics Technology Co., Ltd., Guangdong (CN)

(72) Inventor: Weina Yong, Shenzhen (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 136 days.

(21) Appl. No.: 16/761,913

(22) PCT Filed: Apr. 24, 2020

(86) PCT No.: PCT/CN2020/086743
§ 371 (c)(1),
(2) Date: May 6, 2020

(87) PCT Pub. No.: WO2021/139043
PCT Pub. Date: Jul. 15, 2021

(65) Prior Publication Data
US 2022/0005844 A1 Jan. 6, 2022

(30) Foreign Application Priority Data

Jan. 8, 2020 (CN) .......................... 202010018793.5

(51) Int. Cl.
*H01L 27/12* (2006.01)
*H01L 29/786* (2006.01)
(Continued)

(52) U.S. Cl.
CPC ........ *H01L 27/1288* (2013.01); *G02F 1/1368* (2013.01); *G02F 1/13454* (2013.01);
(Continued)

(58) Field of Classification Search
CPC ............. G02F 1/1368; G02F 1/136204; G02F 2001/133302; G02F 1/133305;
(Continued)

(56) References Cited

U.S. PATENT DOCUMENTS

2004/0058252 A1* 3/2004 Mathuni ................... G03F 1/32
430/5
2008/0198284 A1* 8/2008 Oyamada .......... G02F 1/136213
349/39
(Continued)

FOREIGN PATENT DOCUMENTS

CN 101114119 A 1/2008
CN 103928343 A 7/2014
(Continued)

*Primary Examiner* — Brian Turner
(74) *Attorney, Agent, or Firm* — Luedeka Neely Group, P.C.

(57) ABSTRACT

The present invention provides an array substrate and a manufacturing method thereof. The manufacturing method of the array substrate adopts a multi-stage mask to expose and develop, so that a thickness of a remaining photoresist layer in a channel region corresponding to a display region is same as a thickness of a remaining photoresist layer in a channel region corresponding to a GOA region. Therefore, the two channel regions can be completely etched to prevent short-circuiting, and make up for defects of different action efficiency of developers caused by different densities of thin film transistors in the display region and the GOA region.

9 Claims, 5 Drawing Sheets

(51) Int. Cl.
  *H01L 29/66* (2006.01)
  *H01L 21/8236* (2006.01)
  *G02F 1/1345* (2006.01)
  *G02F 1/1368* (2006.01)
  *G03F 1/32* (2012.01)
  *G03F 1/70* (2012.01)
  *G03F 7/039* (2006.01)
  *G03F 7/40* (2006.01)

(52) U.S. Cl.
  CPC .... *H01L 27/1222* (2013.01); *H01L 29/78696* (2013.01); *G03F 1/32* (2013.01); *G03F 1/70* (2013.01); *G03F 7/039* (2013.01); *G03F 7/40* (2013.01)

(58) Field of Classification Search
  CPC ..... G02F 1/13336; G02F 2001/133368; H01L 27/1222; H01L 29/78696; H01L 27/127; H01L 27/0274; H01L 23/60; H01L 27/0266; H01L 27/1218; H01L 27/1262; H01L 27/1266
  See application file for complete search history.

(56) References Cited

U.S. PATENT DOCUMENTS

| | | |
|---|---|---|
| 2016/0043226 A1 | 2/2016 | Yoon et al. |
| 2018/0175073 A1* | 6/2018 | Wang .................... H01L 27/127 |
| 2021/0183912 A1* | 6/2021 | Liu ...................... H01L 21/3088 |
| 2021/0223639 A1* | 7/2021 | Zhang .................. G02F 1/1368 |
| 2021/0296369 A1* | 9/2021 | Xi ....................... H01L 27/1233 |

FOREIGN PATENT DOCUMENTS

| | | |
|---|---|---|
| CN | 106783953 A | 5/2017 |
| JP | 2014115675 A | 6/2014 |

\* cited by examiner

ARRAY SUBSTRATE AND MANUFACTURING METHOD THEREOF

FIELD OF INVENTION

The present disclosure relates to the field of display technology, and more particularly, to an array substrate and a manufacturing method thereof.

BACKGROUND OF INVENTION

Development trends of thin film transistor liquid crystal displays (TFT-LCDs) are ultra-narrow frames, ultra-low cost, and improved yield. In order to achieve the above purpose, gate driver on array (GOA) technology, which is directly disposing gate driving circuits on array substrates, is used to replace external driving chips.

In GOA products, in addition to thin film transistors in a display region of an array substrate, there are also a lot of thin film transistors located in a GOA region at a periphery of the array substrate; that is, the array substrate includes two types of thin film transistors. In an actual production process, differences in densities of thin film transistors in the display region and the GOA region result in differences in action rate of developers; specifically, a greater area occupied by the display region means a lower density of thin film transistors and a faster development rate; while a smaller area occupied by the GOA region means a greater density of thin film transistors and a slower development rate. Thus, after the array substrate is exposed and developed, a remaining photoresist in the display region and the GOA region has a thickness difference, which may cause a channel region of thin film transistors in the GOA region to not be completely etched so that a source and a drain are short-circuited, and the channel region of thin film transistors in the display region cannot reach a desired design length.

In summary, a new array substrate and a manufacturing method thereof need to be provided to solve the above technical problems.

SUMMARY OF INVENTION

The present disclosure provides an array substrate and a manufacturing method thereof to solve technical problems that a different density of thin film transistors in a display region and a gate driver on array (GOA) region, resulting in difference in action rate of developers in the display region and the GOA region, which causes a channel region of thin film transistors in the GOA region to be not completely etched, thereby causing a source and a drain to be short-circuited.

In order to solve the above technical problems, the present disclosure provides following technical solutions:

An embodiment of the present disclosure provides a manufacturing method of an array substrate comprising following steps:

S10: providing a base substrate, wherein the base substrate comprises a display region and a gate on array (GOA) region, and a gate, a gate insulating layer, an active layer, and a source/drain metal layer are sequentially formed on the base substrate.

S20: forming a photoresist layer on the source/drain metal layer.

S30: using a mask to expose and develop the photoresist layer, so that a thickness of the photoresist layer remaining in a channel region corresponding to the first thin film transistors in the display region is same as a thickness of the photoresist layer remaining in a channel region corresponding to the second thin film transistors in the GOA region, and a light transmittance rate of the mask is determined by a relative content of cadmium metal and cadmium oxide in an adjusting film layer.

S40: ashing a remaining portion of the photoresist layer to completely remove the photoresist layer corresponding to the channel region of the first thin film transistors in the display region and corresponding to the channel region of the second thin film transistors in the GOA region.

S50: etching the source/drain metal layer corresponding to the display region and the GOA region to form a source/drain and the channel region of the first thin film transistors in the display region, and a source/drain and the channel region of the second thin film transistors in the GOA region.

According to the manufacturing method of the array substrate provided by the embodiment of the present disclosure, a density of the first thin film transistors in the display region is less than a density of the second thin film transistors in the GOA region.

According to the manufacturing method of the array substrate provided by the embodiment of the present disclosure, the photoresist layer is a positive photoresist layer, and a light transmittance rate of the mask corresponding to the GOA region is less than a light transmittance rate of the mask corresponding to the display region.

According to the manufacturing method of the array substrate provided by the embodiment of the present disclosure, the light transmittance rate of the mask corresponding to the display region ranges from 20% to 60% of the light transmittance rate of the mask corresponding to the GOA region.

According to the manufacturing method of the array substrate provided by the embodiment of the present disclosure, a thickness of the mask corresponding to the display region is greater than a thickness of the mask corresponding to the GOA region.

According to the manufacturing method of the array substrate provided by the embodiment of the present disclosure, a length of the channel region of the first thin film transistors is same as a length of the channel region of the second thin film transistors, and a distance between every two adjacent first thin film transistors is greater than a distance between each two adjacent second thin film transistors.

According to the manufacturing method of the array substrate provided by the embodiment of the present disclosure, a length of the channel region of the first thin film transistors is greater than a length of the channel region of the second thin film transistors, and a distance between every two adjacent first thin film transistors is same as a distance between each two adjacent second thin film transistors.

According to the manufacturing method of the array substrate provided by the embodiment of the present disclosure, the mask is a halftone mask, a grayscale mask, or a combination of both.

An embodiment of the present disclosure provides a manufacturing method of an array substrate comprising following steps:

S10: providing a base substrate, wherein the base substrate comprises a display region and a gate on array (GOA) region, and a gate, a gate insulating layer, an active layer, and a source/drain metal layer are sequentially formed on the base substrate.

S20: forming a photoresist layer on the source/drain metal layer.

S30: using a mask to expose and develop the photoresist layer, so that a thickness of the photoresist layer remaining in a channel region corresponding to the first thin film transistors in the display region is same as a thickness of the photoresist layer remaining in a channel region corresponding to the second thin film transistors in the GOA region.

S40: ashing a remaining portion of the photoresist layer to completely remove the photoresist layer corresponding to the channel region of the first thin film transistors in the display region and corresponding to the channel region of the second thin film transistors in the GOA region.

S50: etching the source/drain metal layer corresponding to the display region and the GOA region to form a source/drain and the channel region of the first thin film transistors in the display region, and a source/drain and the channel region of the second thin film transistors in the GOA region.

According to the manufacturing method of the array substrate provided by the embodiment of the present disclosure, a density of the first thin film transistors in the display region is less than a density of the second thin film transistors in the GOA region.

According to the manufacturing method of the array substrate provided by the embodiment of the present disclosure, the photoresist layer is a positive photoresist layer, and a light transmittance rate of the mask corresponding to the GOA region is less than a light transmittance rate of the mask corresponding to the display region.

According to the manufacturing method of the array substrate provided by the embodiment of the present disclosure, the light transmittance rate of the mask corresponding to the display region ranges from 20% to 60% of the light transmittance rate of the mask corresponding to the GOA region.

According to the manufacturing method of the array substrate provided by the embodiment of the present disclosure, a thickness of the mask corresponding to the display region is greater than a thickness of the mask corresponding to the GOA region.

According to the manufacturing method of the array substrate provided by the embodiment of the present disclosure, a length of the channel region of the first thin film transistors is same as a length of the channel region of the second thin film transistors, and a distance between every two adjacent first thin film transistors is greater than a distance between each two adjacent second thin film transistors.

According to the manufacturing method of the array substrate provided by the embodiment of the present disclosure, a length of the channel region of the first thin film transistors is greater than a length of the channel region of the second thin film transistors, and a distance between every two adjacent first thin film transistors is same as a distance between each two adjacent second thin film transistors.

According to the manufacturing method of the array substrate provided by the embodiment of the present disclosure, the mask is a halftone mask, a grayscale mask, or a combination of both.

An embodiment of the present disclosure provides an array substrate, which comprises a base substrate comprising a display region and a gate on array (GOA) region; first thin film transistors disposed on the display region of the base substrate, wherein the first thin film transistors comprise a first gate, an insulating layer, an active layer, and a source/drain and a channel region located on the active layer; and second thin film transistors disposed on the GOA region of the base substrate, wherein the second thin film transistors comprise a second gate, the insulating layer, the active layer, and the source/drain and the channel region located on the active layer. Wherein, a depth of the channel region of the first thin film transistors in a direction perpendicular to an upper surface of the base substrate is same as a depth of the channel region of the second thin film transistors in a direction perpendicular to an upper surface of the base substrate.

According to the array substrate provided by the embodiment of the present disclosure, a density of the first thin film transistors in the display region is less than a density of the second thin film transistors in the GOA region.

Beneficial effects of the present disclosure are that the present disclosure provides an array substrate and a manufacturing method thereof. A photoresist layer on a source/drain metal layer is exposed and developed by a multi-stage mask, so that a thickness of a photoresist layer remaining in a channel region corresponding to the first thin film transistors in a display region is same as a thickness of a photoresist layer remaining in a channel region corresponding to the second thin film transistors in a GOA region. Thus, the photoresist layer is completely removed after an ashing process, so that the subsequent channel region of the first thin film transistors and the subsequent channel region of the second thin film transistors can be completely etched, which prevents short-circuiting between a source/drain of the first thin film transistors and a source/drain of the second thin film transistors, so as to make up for defects of different action efficiency of developers caused by different densities of thin film transistors in the display region and the GOA region.

DESCRIPTION OF DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc., are only directions by referring to the accompanying drawings. Thus, the adopted directional terms are used to describe and understand the present disclosure, but the present disclosure is not limited thereto. In figures, elements with similar structures are indicated by the same numbers.

The present disclosure is directed to a current array substrate and a manufacturing method thereof. The present embodiment can solve defects of differences in density of thin film transistors in a display region and a gate driver on array (GOA) region, which result in differences in action rate of developers in the display region and the GOA region, which causes a channel region of thin film transistors in the GOA region to be not completely etched, thereby causing a source and a drain to be short-circuited.

Figure 1:
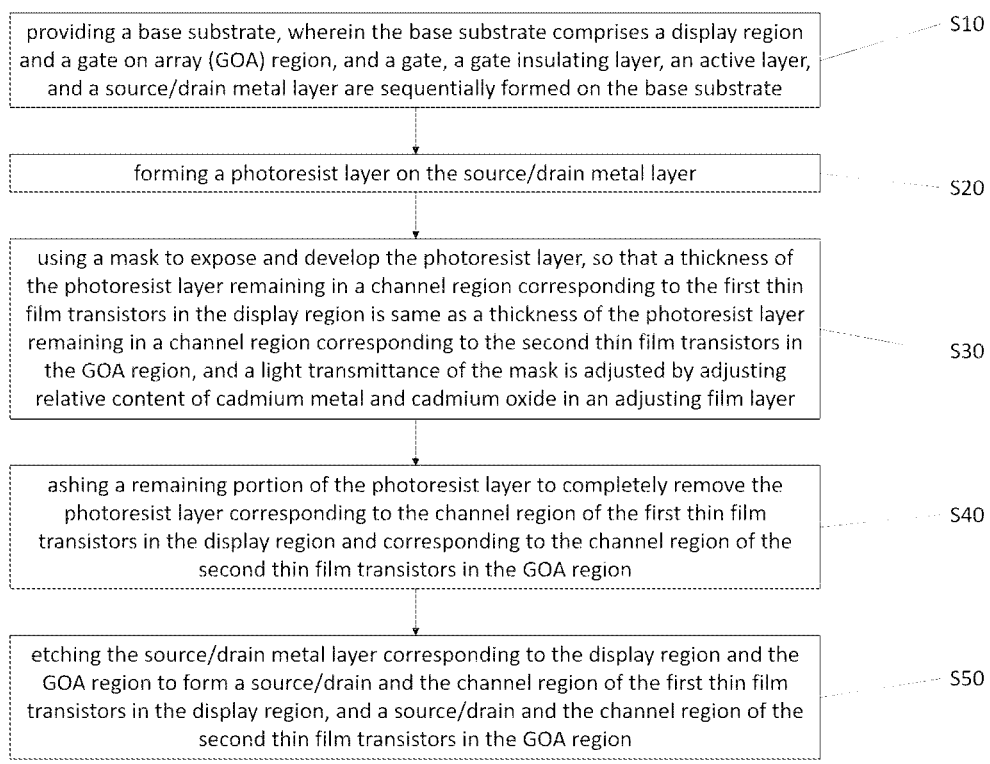
FIG. 1 is a flow chart of a manufacturing method of an array substrate provided by an embodiment of the present disclosure.

As shown in FIG. 1, an embodiment of the present disclosure provides a manufacturing method of an array substrate 1. It should be noted that a manufacturing method of a bottom-gate array substrate is described as an example by the embodiment of the present disclosure, and a manufacturing method of a top-gate array substrate is also within protection scope of the present disclosure. The manufacturing method of the array substrate 1 comprises following steps:

S10: providing a base substrate 10. The base substrate 10 comprises a display region 100a and a gate on array (GOA) region 100b, and a gate, a gate insulating layer 30, an active layer 40, and a source/drain metal layer 50 are sequentially formed on the base substrate 10.

A plurality of first thin film transistor 11 are formed on the display region 100a which is used to achieve image displays, and a plurality of second thin film transistor 12 are formed on the GOA region 100b which is used to output a gate scanning signal. The gate scanning signal is output to the first thin film transistors 11 in the display region 100a and is used to drive a column of pixel units of in the display region 100a to be turned on or turned off.

Figure 2:
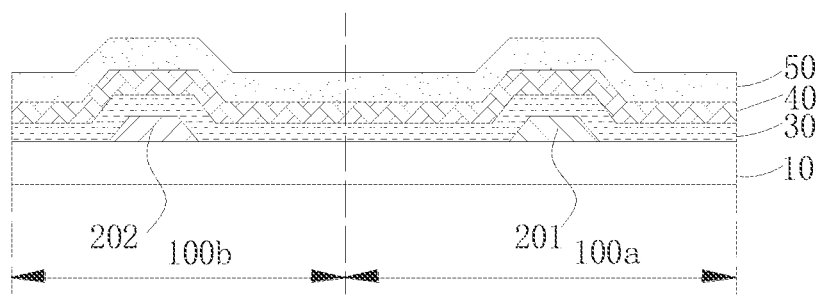
FIG. 2 to FIG. 7 are schematic flow charts of the manufacturing method of the array substrate provided by the embodiment of the present disclosure.

Specifically, as shown in FIG. 2, a first gate 201 is formed in the display region 100a of the base substrate 10 and a second gate 202 is formed in the GOA region 100b by using a first photolithography process, and the gate insulating layer 30, the active layer 40, and the source/drain metal layer are sequentially formed on the first gate 201, the second gate 202, and the base substrate 10 by deposition, coating, or sputtering.

S20: forming a photoresist layer 60 on the source/drain metal layer 50.

Figure 3:
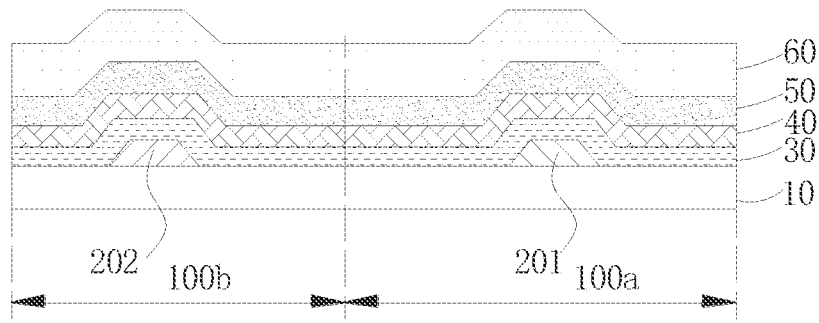

Specifically, as shown in FIG. 3, a photoresist is coated on an upper surface of the source/drain metal layer 50 to form the photoresist layer 60. In the embodiment of the present disclosure, the photoresist layer is a positive photoresist layer.

S30: using a mask 2 to expose and develop the photoresist layer 60, so that a thickness of the photoresist layer 60 remaining in a channel region corresponding to the first thin film transistors 11 in the display region 100a is same as a thickness of the photoresist layer 60 remaining in a channel region corresponding to the second thin film transistors 12 in the GOA region 100b.

Figure 4:
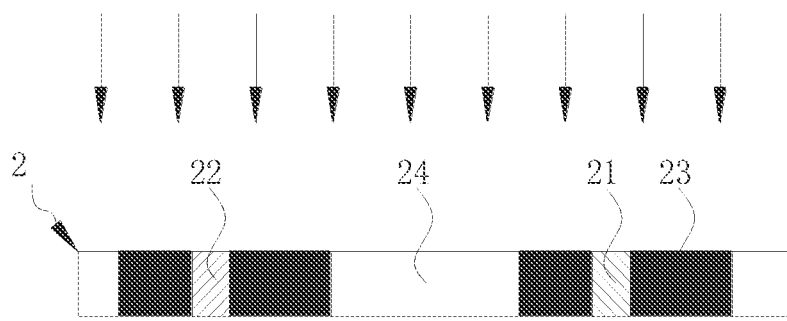
Figure 4:
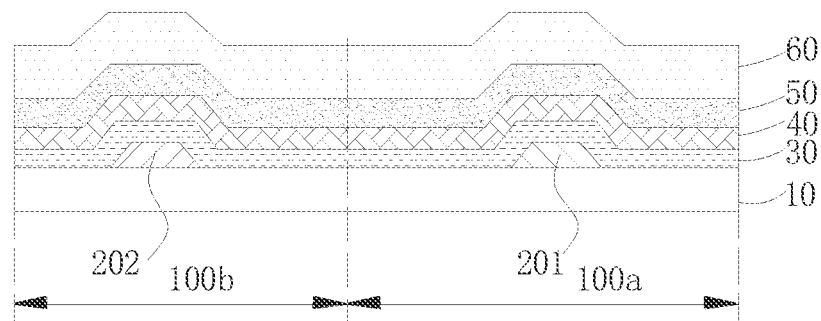
Figure 5:
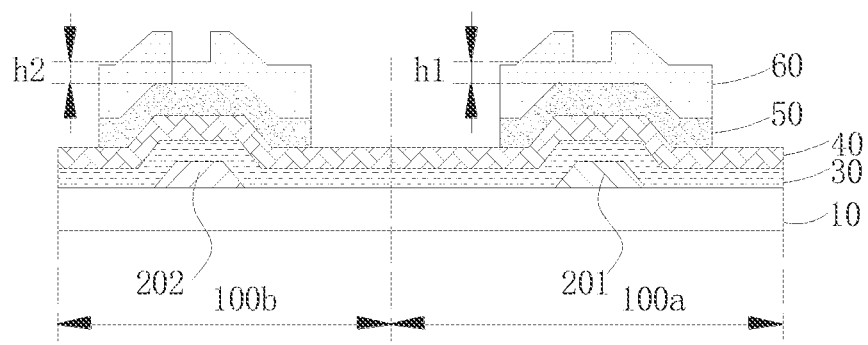

Specifically, shown in FIG. 4 is a schematic diagram of an exposure process of the array substrate and shown in FIG. 5 is a schematic diagram of a development process of the array substrate. When developing the photoresist layer 60 after the exposure process, it may be developed by developers. Since a density of the first thin film transistors 11 in the display region 100a is generally less than a density of the second thin film transistors 12 in the GOA region 100b, and the developers have a faster development rate in the display region 100a with a lower density, and have a slower development rate in the GOA region 100a with a greater density, after the development process, there is a certain thickness difference between the remaining photoresist layer 60 in the display region 100a and the remaining photoresist layer 60 in the GOA region 100b, which is prone to affect subsequent processing steps.

Therefore, in the embodiment of the present disclosure, the photoresist layer 60 is exposed by the mask 2, and the mask 2 is a multi-stage mask. Light transmittance rate of the mask 2 corresponding to the GOA region 100b is greater than light transmittance rate of the mask 2 corresponding to the display region 100a. Specifically, the mask comprises a first translucent region 21, a second translucent region 22, a non-light-transmittance region 23, and a light-transmittance region 24, wherein the first translucent region 21 corresponds to the channel region of the first thin film transistors 11, the second translucent region 22 corresponds to the channel region of the second thin film transistors 12, the non-light-transmittance region 23 corresponds to a source/drain region, and the light-transmittance region 24 corresponds to other regions.

Light transmittance rate of the first translucent region 21 is less than light transmittance rate of the second translucent region 22, so that a photosensitive portion of the photoresist layer 60 corresponding to the channel region of the second thin film transistors 12 in a thickness direction is greater than a photosensitive portion of the photoresist layer 60 corresponding to the channel region of the first thin film transistors 11 in a thickness direction, thereby making up for defects of different action efficiency of developers caused by different densities of thin film transistors in the display region and the GOA region. Therefore, after the exposure process and the development process, a thickness h2 of the photoresist layer 60 remaining in the channel region corresponding to the second thin film transistors 12 is same as a thickness h1 of the photoresist layer 60 remaining in the channel region corresponding to first thin film transistors 11.

Preferably, light transmittance rate of the mask 2 corresponding to the display region 100a ranges from 20% to 60% of the light transmittance rate of the mask 2 corresponding to the GOA region 100b; that is, light transmittance rate of the first translucent region 21 ranges from 20% to 60% of light transmittance rate of the second translucent region 22.

It should be understood that when a difference between the density of the first thin film transistors 11 in the display region 100a and the density of the second thin film transistor 12 in the GOA region 100b is greater, a greater difference between light transmittance rate of the first translucent region 21 and light transmittance rate of the second translucent region 22 is designed; in contrast, when the difference between the density of the first thin film transistors 11 in the display region 100a and the density of the second thin film transistor 12 in the GOA region 100b is less, a less difference between light transmittance rate of the first translucent region 21 and light transmittance rate of the second translucent region 22 is designed, and it should be adjusted according to actual situation.

Specifically, if initial light transmittance rate of the mask 2 is 50%, in actual production process, the thickness difference between the photoresist layer 60 remaining in the channel region of the second thin film transistors 12 and the photoresist layer 60 remaining in the channel region of the first thin film transistors 11 after the exposure process reaches 600 Å. In general, a difference in light transmittance rate is 1%, so the thickness difference is 300 Å, therefore, light transmittance rate of each part of the mask 2 can be adjusted and matched by using this trend, and the details are as follows:

The light transmittance rate of the first translucent region 21 is 50%, and the light transmittance rate of the second translucent region 22 is 52%.

The light transmittance rate of the first translucent region 21 is 48%, and the light transmittance rate of the second translucent region 22 is 50%.

The light transmittance rate of the first translucent region 21 is 49%, and the light transmittance rate of the second translucent region 22 is 51%.

Furthermore, in one embodiment, the light transmittance rate of the mask 2 can be determined by a relative content of cadmium metal and cadmium oxide in an adjusting film layer, wherein the content of cadmium metal in the adjusting film layer of the first translucent region 21 is greater, and the content of cadmium oxide in the adjusting film layer of the second translucent region 22 is greater.

In addition, the mask 2 may be a halftone mask, a grayscale mask, or a combination of both.

S40: ashing a remaining portion of the photoresist layer 60 to completely remove the photoresist layer 60 corresponding to the channel region of the first thin film transistors 11 in the display region 100a and corresponding to the channel region of the second thin film transistors 12 in the GOA region 100b.

Figure 6:
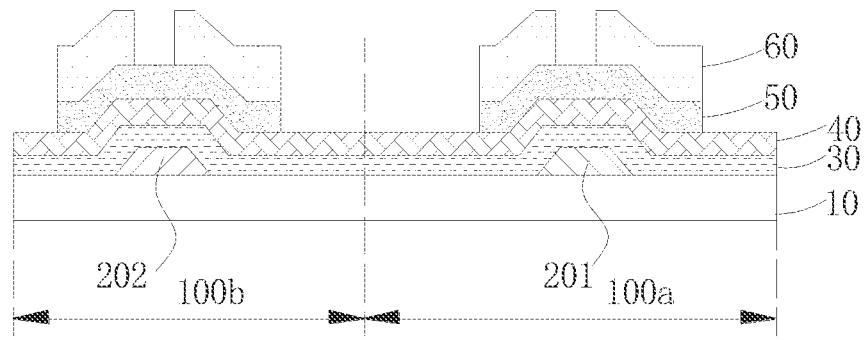

Specifically, as shown in FIG. 6, the photoresist layer 60 corresponding to the channel region of the first thin film transistors 11 in the display region 100a and corresponding to the channel region of the second thin film transistors 12 in the GOA region 100b are completely removed by an ashing process, thereby preventing the photoresist layer 60 from remaining. Therefore, a metal layer in the channel region of the second thin film transistors 12 is not completely etched and the active layer is not exposed, resulting in a short-circuit between a source and a drain. If there is no residue of the photoresist layer 60 corresponding to the channel region of the second thin film transistors 12, the channel region of the first thin film transistors 11 cannot reach a desired design length.

S50: etching the source/drain metal layer 50 corresponding to the display region 100a and the GOA region 100b to form a source/drain and the channel region of the first thin film transistors 11 in the display region 100a, and a source/drain and the channel region of the second thin film transistors 12 in the GOA region 100b.

Figure 7:
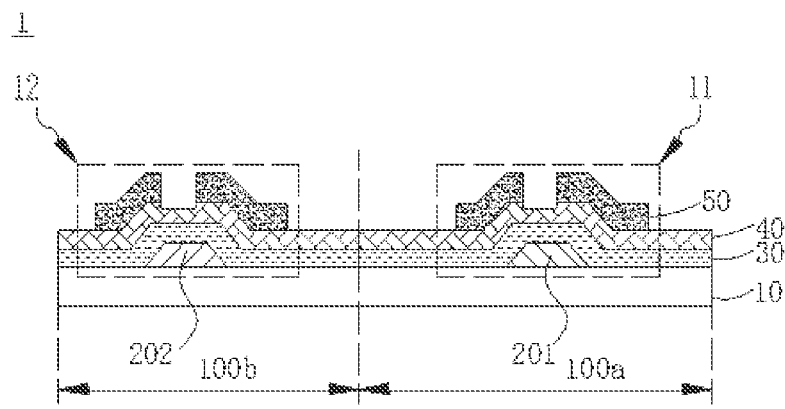

Specifically, as shown in FIG. 7, a wet etching process may be performed by using an etching solution, and then a dry etching process is performed to expose the active layer 40, thereby forming a source/drain and a channel region between the source/drain, and further forming the first thin film transistors 11 and the second thin film transistors 12.

Figure 8:
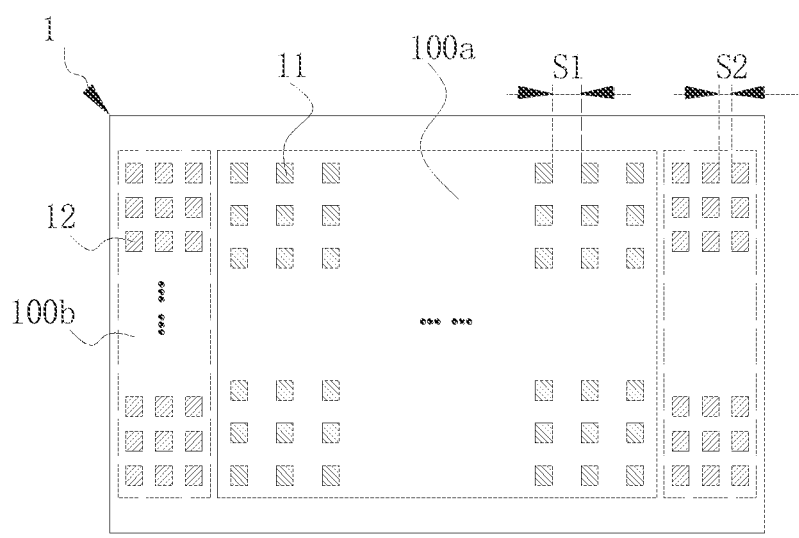
FIG. 8 is a schematic plane structure diagram of an array substrate provided by an embodiment of the present disclosure.

Wherein, the density of the first thin film transistors 11 is less than the density of the second thin film transistors 12. Specifically, as shown in FIG. 8, a length of the channel region of the first thin film transistors 11 is same as a length of the channel region of the second thin film transistors 12, and a distance S1 between every two adjacent first thin film transistors 11 is greater than a distance S2 between every two adjacent second thin film transistors 12.

Figure 9:
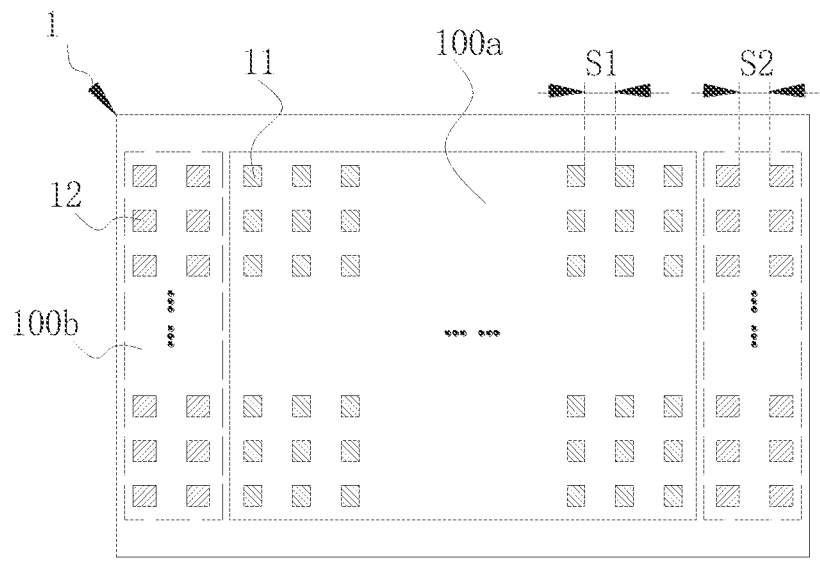
FIG. 9 is a schematic plane structure diagram of another array substrate provided by the embodiment of the present disclosure.

Furthermore, as shown in FIG. 9, the length of the channel region of the first thin film transistors 11 is greater than the length of the channel region of the second thin film transistors 12, and the distance S1 between every two adjacent first thin film transistors 11 is same as the distance S2 between every two adjacent second thin film transistors 12.

It should be noted that the density of the first thin film transistors 11 is less than the density of the second thin film transistor 12, which is mainly described as an example by the embodiment of the present disclosure. For design or process reasons, the remaining photoresist layer 60 in different regions corresponding to the array substrate 1 after exposure and development may have a thickness difference; such as a direction in which developers flow. Therefore, the mask 2 with multiple light transmittance rates in the embodiments of the present disclosure may also be used for the exposure process, which is not repeated here.

Figure 10:
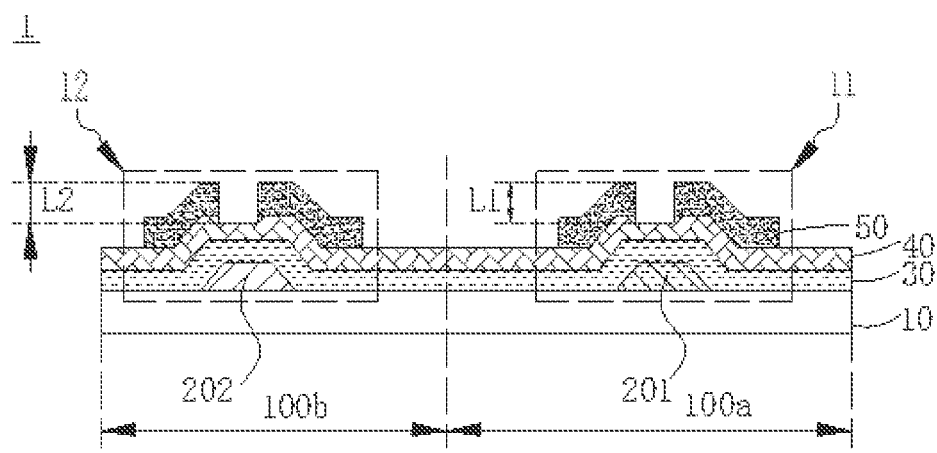
FIG. 10 is a schematic sectional structure diagram of the array substrate provided by the embodiment of the present disclosure.

As shown in FIG. 10, the embodiment of the present disclosure further provides an array substrate 1 prepared by using the above manufacturing method, and the array substrate 1 comprises a base substrate 10, and first thin film transistors 11 and second thin film transistors 12 disposed on the base substrate 10.

The base substrate 10 comprises a display region 100a and a gate on array (GOA) region, and the first thin film transistors 11 are disposed on the display region 100a. The first thin film transistors 11 comprise a first gate 201, a gate insulating layer 30, an active layer 40, and a source/drain metal layer 50, and the source/drain metal layer 50 comprises a source/drain and a channel region located on the display region 100a. The second thin film transistors 12 are disposed on the GOA region, and the second thin film transistors comprise a second gate 202, the gate insulating layer 30, the active layer, and the source/drain metal layer 50 comprises a source/drain and a channel region located on the GOA region 100b.

Wherein, a depth L2 of the channel region of the first thin film transistors in a direction perpendicular to an upper surface of the base substrate is same as a L1 depth of the channel region of the second thin film transistors 12 in a direction perpendicular to an upper surface of the base substrate 10.

Refer to FIG. 8 and FIG. 9 again, a density of the first thin film transistors in the display region 100a is less than a density of the second thin film transistors in the GOA region 100b.

Beneficial effects of the present disclosure are that the present disclosure provides an array substrate and a manufacturing method thereof. A photoresist layer on a source/drain metal layer is exposed and developed by a multi-stage mask, so that a thickness of a photoresist layer remaining in a channel region corresponding to the first thin film transistors in a display region is same as a thickness of a photoresist layer remaining in a channel region corresponding to the second thin film transistors in a GOA region. Thus, the photoresist layer is completely removed after an ashing process, so that the subsequent channel region of the first thin film transistors and the subsequent channel region of the second thin film transistors can be completely etched, which prevents short-circuiting between a source/drain of the first thin film transistors and a source/drain of the second thin film transistors, so as to make up for defects of different action efficiency of developers caused by different densities of thin film transistors in the display region and the GOA region.

In summary, although the present disclosure has been disclosed as above with preferred embodiments, the above preferred embodiments are not intended to limit the present disclosure. Those skilled in the art can make various modifications and retouching without departing from spirit and a scope of the present disclosure. Therefore, a protection scope of the present disclosure is subject to the scope defined by claims.

What is claimed is:

1. A manufacturing method of an array substrate, comprising following steps:
    S10: providing a base substrate, wherein the base substrate comprises a display region and a gate on array (GOA) region, and a gate, a gate insulating layer, an active layer, and a source/drain metal layer are sequentially formed on the base substrate;
    S20: forming a photoresist layer on the source/drain metal layer;
    S30: using a mask to expose and develop the photoresist layer, so that a thickness of the photoresist layer remaining in a channel region corresponding to the first thin film transistors in the display region is same as a thickness of the photoresist layer remaining in a channel region corresponding to the second thin film transistors in the GOA region, and a light transmittance rate of the mask is determined by a relative content of cadmium metal and cadmium oxide in an adjusting film layer;
    S40: ashing a remaining portion of the photoresist layer to completely remove the photoresist layer corresponding to the channel region of the first thin film transistors in the display region and corresponding to the channel region of the second thin film transistors in the GOA region; and
    S50: etching the source/drain metal layer corresponding to the display region and the GOA region to form a source/drain of the first thin film transistors and the channel region of the first thin film transistors in the display region, and a source/drain of the second thin film transistors and the channel region of the second thin film transistors in the GOA region.

2. The manufacturing method of the array substrate as claimed in claim 1, wherein a density of the first thin film transistors in the display region is less than a density of the second thin film transistors in the GOA region.

3. The manufacturing method of the array substrate as claimed in claim 2, wherein the photoresist layer is a positive photoresist layer, and a light transmittance rate of the mask corresponding to the GOA region is greater than a light transmittance rate of the mask corresponding to the display region.

4. The manufacturing method of the array substrate as claimed in claim 3, wherein the light transmittance rate of the mask corresponding to the display region ranges from 20% to 60% of the light transmittance rate of the mask corresponding to the GOA region.

5. The manufacturing method of the array substrate as claimed in claim 2, wherein a length of the channel region of the first thin film transistors is same as a length of the channel region of the second thin film transistors, and a distance between every two adjacent first thin film transistors is greater than a distance between every two adjacent second thin film transistors.

6. The manufacturing method of the array substrate as claimed in claim 2, wherein a length of the channel region of the first thin film transistors is greater than a length of the channel region of the second thin film transistors, and a distance between every two adjacent first thin film transistors is same as a distance between every two adjacent second thin film transistors.

7. The manufacturing method of the array substrate as claimed in claim 1, wherein the mask is a halftone mask, a grayscale mask, or a combination of both.

8. An array substrate, comprising:
    a base substrate comprising a display region and a gate on array (GOA) region;
    first thin film transistors disposed on the display region of the base substrate, wherein the first thin film transistors comprise a first gate, an insulating layer, an active layer, and a source/drain and a channel region located on the active layer; and
    second thin film transistors disposed on the GOA region of the base substrate, wherein the second thin film transistors comprise a second gate, the insulating layer, the active layer, and the source/drain and the channel region located on the active layer;
    wherein a depth of the channel region of the first thin film transistors in a direction perpendicular to an upper surface of the base substrate is same as a depth of the channel region of the second thin film transistors in a direction perpendicular to an upper surface of the base substrate; and
    the array substrate is manufactured by the manufacturing method according to claim 1.

9. The array substrate as claimed in claim 8, wherein a density of the first thin film transistors in the display region is less than a density of the second thin film transistors in the GOA region.

* * * * *